US012603438B2

(12) United States Patent
Patrick et al.

(10) Patent No.: US 12,603,438 B2
(45) Date of Patent: Apr. 14, 2026

(54) QUASI-HELICAL ANTENNAS AND ASSOCIATED MANUFACTURING METHODS

(71) Applicant: ELECTRONIC DESIGN & DEVELOPMENT, CORP., Tucson, AZ (US)

(72) Inventors: Kevin W. Patrick, Tucson, AZ (US); Sergio E. Cardona, Jr., Tucson, AZ (US)

(73) Assignee: ELECTRONIC DESIGN & DEVELOPMENT, CORP., Tucson, AZ (US)

( * ) Notice: Subject to any disclaimer, the term of this patent is extended or adjusted under 35 U.S.C. 154(b) by 320 days.

(21) Appl. No.: 18/193,527

(22) Filed: Mar. 30, 2023

(65) Prior Publication Data

US 2023/0291113 A1     Sep. 14, 2023

Related U.S. Application Data

(63) Continuation-in-part of application No. PCT/US2021/053003, filed on Sep. 30, 2021.

(Continued)

(51) Int. Cl.
*H01Q 1/36*          (2006.01)
*H01Q 11/08*          (2006.01)
(Continued)

(52) U.S. Cl.
CPC .............. *H01Q 11/08* (2013.01); *H05K 3/10* (2013.01); *H05K 3/4038* (2013.01); *H05K 3/4644* (2013.01)

(58) Field of Classification Search
CPC .. H01Q 1/36; H01Q 1/40; H01Q 1/48; H01Q 11/08; H05K 3/10; H05K 3/4038; H05K 3/4644
See application file for complete search history.

(56) References Cited

U.S. PATENT DOCUMENTS 4,122,406 A     10/1978  Salzberg
6,501,438 B2 *  12/2002  Nevermann ........... H01Q 5/378
                                                                        343/895

(Continued)

FOREIGN PATENT DOCUMENTS

WO     2018051238 A1     3/2018
WO     2019221920 A1     11/2019

OTHER PUBLICATIONS

Hui et al. "Numerical and experimental studies of a helical antenna loaded by a dielectric resonator." Radio Science 32.2 (1997): 295-304.

(Continued)

*Primary Examiner* — Tho G Phan
(74) *Attorney, Agent, or Firm* — NGUYEN TARBET IP LAW

(57)          ABSTRACT

A dielectric waveguide antenna and manufacturing method, as well as a quasi-helical antenna device. The electrically conducting features within the dielectric waveguide antenna are manufactured using standard printed circuit board (PCB) manufacturing technology. Internal elements of the PCB antenna construction may be capacitively coupled or galvanically coupled. The final outer form of the dielectric waveguide antenna is machined by turning on a lathe, and the final outer form is accurately aligned and registered to the electrically conducting features within. The quasi-helical antenna device comprises a repeating, periodic, chain of substantially straight conductive segments that are wound about a central axis. The quasi-helical antenna is fabricated within a planar printed circuit.

11 Claims, 9 Drawing Sheets

Related U.S. Application Data

(60) Provisional application No. 63/085,892, filed on Sep. 30, 2020.

(51) Int. Cl.
   | | |
   |---|---|
   | *H05K 3/10* | (2006.01) |
   | *H05K 3/40* | (2006.01) |
   | *H05K 3/46* | (2006.01) |

(56) References Cited

U.S. PATENT DOCUMENTS

| | | | | |
|---|---|---|---|---|
| 6,784,850 | B2 * | 8/2004 | Morooka | H01Q 1/362 343/895 |
| 6,784,853 | B2 * | 8/2004 | Ikramov | H01Q 9/28 343/895 |
| 8,552,918 | B2 * | 10/2013 | Lee | H01Q 5/321 343/702 |
| 9,214,734 | B2 * | 12/2015 | Huynh | H01Q 5/378 |
| 9,899,746 | B2 * | 2/2018 | Grandfield | H01Q 1/362 |
| 10,418,679 | B2 | 9/2019 | Parekh et al. | |
| 10,461,410 | B2 * | 10/2019 | Fedan | H01Q 1/362 |
| 11,264,698 | B2 * | 3/2022 | Destraves | H04B 1/59 |
| 2003/0003881 | A1 | 1/2003 | Anim-Appiah et al. | |
| 2003/0146872 | A1 | 8/2003 | Kellerman et al. | |
| 2006/0103576 | A1 | 5/2006 | Mahmoud et al. | |
| 2009/0278759 | A1 | 11/2009 | Moon et al. | |
| 2011/0001680 | A1 | 1/2011 | Leisten | |
| 2011/0281603 | A1 | 11/2011 | Lastinger et al. | |
| 2012/0092089 | A1 | 4/2012 | Zhu et al. | |
| 2012/0188142 | A1 | 7/2012 | Shashi et al. | |
| 2012/0287018 | A1 | 11/2012 | Parsche | |
| 2013/0214871 | A1 | 8/2013 | Nakamura et al. | |
| 2015/0048996 | A1 | 2/2015 | Aubert et al. | |
| 2016/0029225 | A1 | 1/2016 | Hu | |
| 2016/0359539 | A1 | 12/2016 | Ashrafi et al. | |
| 2017/0093693 | A1 | 3/2017 | Barzegar et al. | |
| 2017/0222334 | A1 | 8/2017 | Shtrom et al. | |
| 2017/0318589 | A1 | 11/2017 | Negus | |
| 2018/0090830 | A1 | 3/2018 | McMichael et al. | |
| 2018/0331720 | A1 | 11/2018 | Adriazola et al. | |
| 2019/0103665 | A1 | 4/2019 | Yoo et al. | |
| 2019/0181926 | A1 | 6/2019 | Liang et al. | |
| 2019/0348759 | A1 | 11/2019 | Walker et al. | |
| 2019/0379427 | A1 | 12/2019 | Geekie et al. | |
| 2019/0392694 | A1 | 12/2019 | Funaki et al. | |
| 2021/0159608 | A1 | 5/2021 | Verd et al. | |
| 2021/0167811 | A1 | 6/2021 | Henry et al. | |

OTHER PUBLICATIONS

Rousstia et al., "Switched-beam array of dielectric rod antenna with RF-MEMS switch for millimeter-wave applications", Radio Sci., 2015, 50, 177-190.

Black et al., "Breaking Down mmWave Barriers with Holographic Beam Forming", MW Journal, Feb. 2020, vol. 63, No. 2.

Rein, Steve. "Waveguide Primer." Microwaves101, everythingRF, p. 1-7, Accessed Jan. 12, 2022. https://www.microwaves101.com/encyclopedias/waveguide-primer.

Chu, Qing-Xin, Ding-Liang Wen, and Yu Luo. "A broadband dual-polarized antenna with Y-shaped feeding lines." IEEE Transactions on Antennas and Propagation 63.2 (2015): 483-490.

* cited by examiner

Figure 4B:
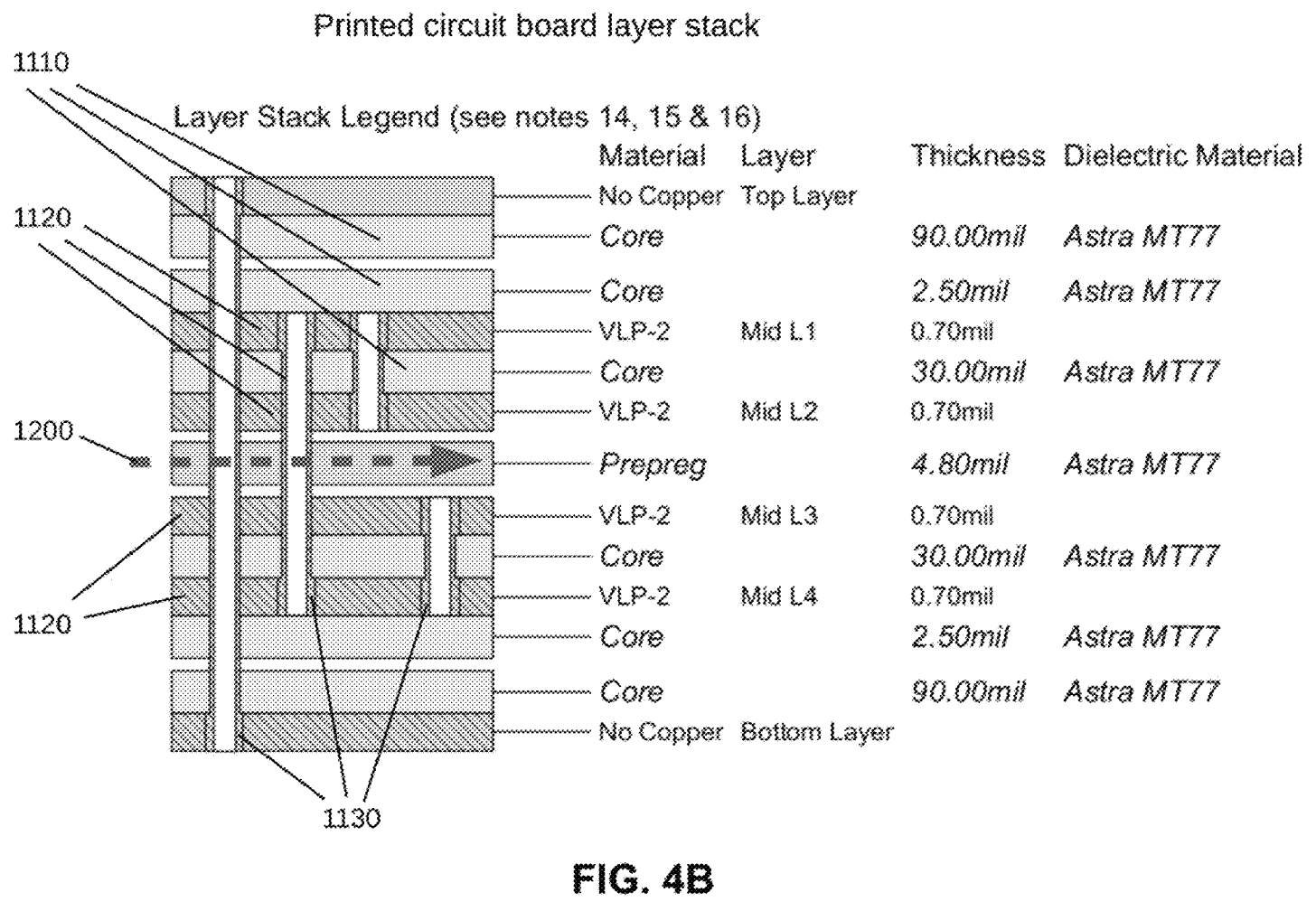

Printed circuit board layer stack

Layer Stack Legend (see notes 14, 15 & 16)

| Material | Layer | Thickness | Dielectric Material |
|---|---|---|---|
| No Copper | Top Layer | | |
| Core | | 90.00mil | Astra MT77 |
| Core | | 2.50mil | Astra MT77 |
| VLP-2 | Mid L1 | 0.70mil | Astra MT77 |
| Core | | 30.00mil | Astra MT77 |
| VLP-2 | Mid L2 | 0.70mil | Astra MT77 |
| Prepreg | | 4.80mil | Astra MT77 |
| VLP-2 | Mid L3 | 0.70mil | Astra MT77 |
| Core | | 30.00mil | Astra MT77 |
| VLP-2 | Mid L4 | 0.70mil | Astra MT77 |
| Core | | 2.50mil | Astra MT77 |
| Core | | 90.00mil | Astra MT77 |
| No Copper | Bottom Layer | | |

Printed circuit board layer stack

| Layer Stack Legend (see notes 14, 15 & 16) | | | |
|---|---|---|---|
| Material | Layer | Thickness | Dielectric Material |
| No Copper | Top Layer | | |
| Core | | 90.00mil | Astra MT77 |
| Core | | 2.50mil | Astra MT77 |
| VLP-2 | Mid L1 | 0.70mil | |
| Core | | 30.00mil | Astra MT77 |
| VLP-2 | Mid L2 | 0.70mil | |
| Prepreg | | 4.80mil | Astra MT77 |
| VLP-2 | Mid L3 | 0.70mil | |
| Core | | 30.00mil | Astra MT77 |
| VLP-2 | Mid L4 | 0.70mil | |
| Core | | 2.50mil | Astra MT77 |
| Core | | 90.00mil | Astra MT77 |
| No Copper | Bottom Layer | | |

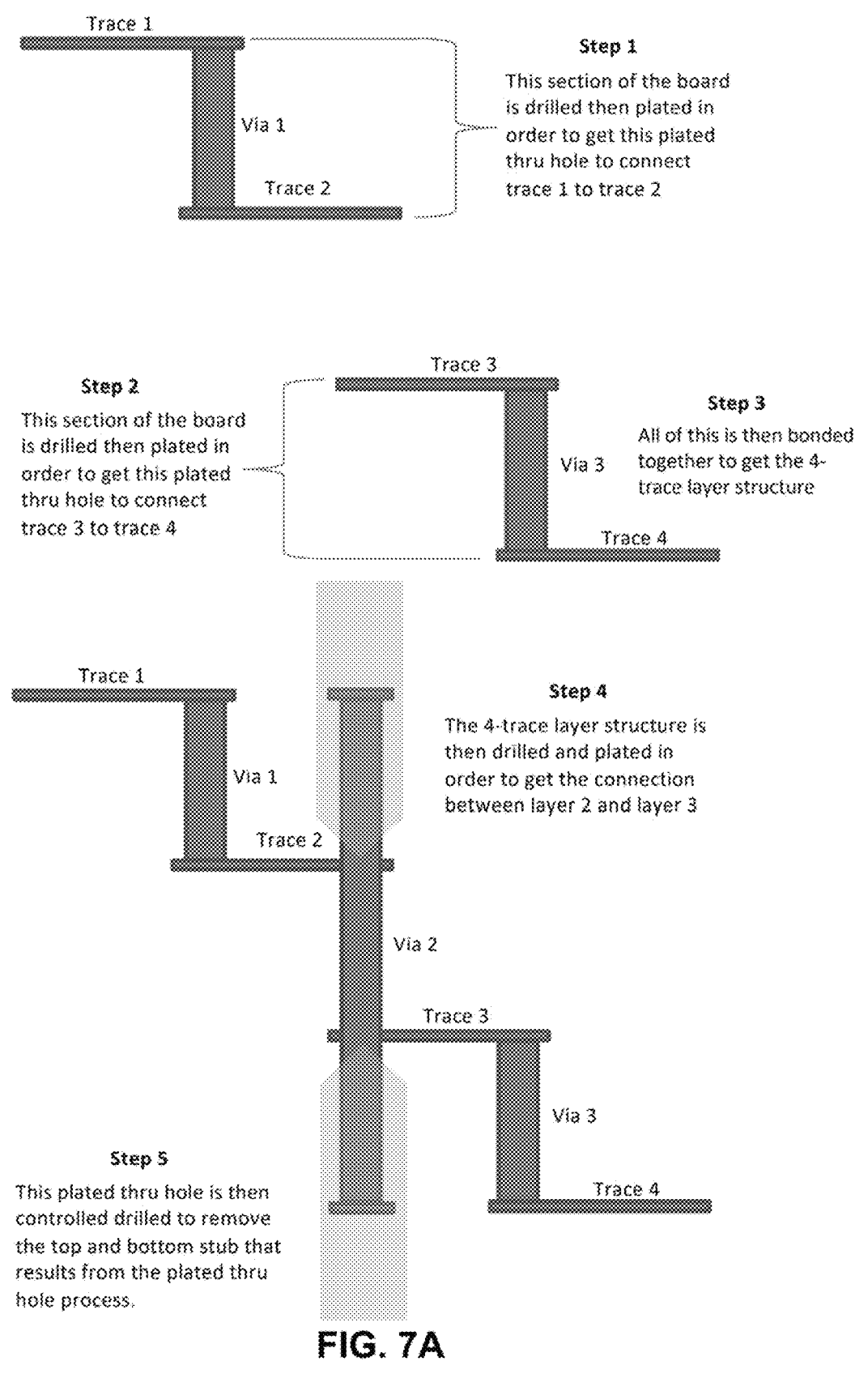

Trace 1

Via 1

Trace 2

Step 1

This section of the board is drilled then plated in order to get this plated thru hole to connect trace 1 to trace 2

Step 2

This section of the board is drilled then plated in order to get this plated thru hole to connect trace 3 to trace 4

Trace 3

Via 3

Trace 4

Step 3

All of this is then bonded together to get the 4-trace layer structure

Trace 1

Via 1

Trace 2

Via 2

Trace 3

Via 3

Trace 4

Step 4

The 4-trace layer structure is then drilled and plated in order to get the connection between layer 2 and layer 3

Step 5

This plated thru hole is then controlled drilled to remove the top and bottom stub that results from the plated thru hole process.

FIG. 7A

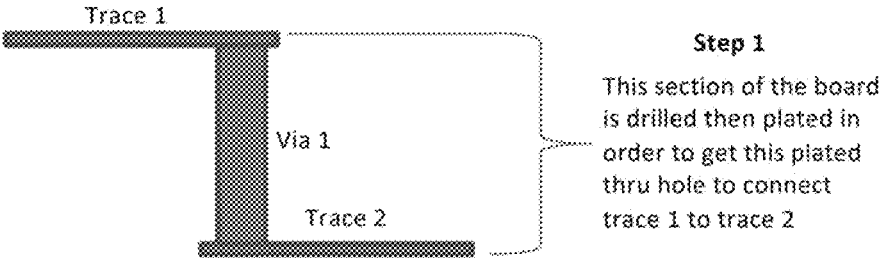

Step 1

This section of the board is drilled then plated in order to get this plated thru hole to connect trace 1 to trace 2

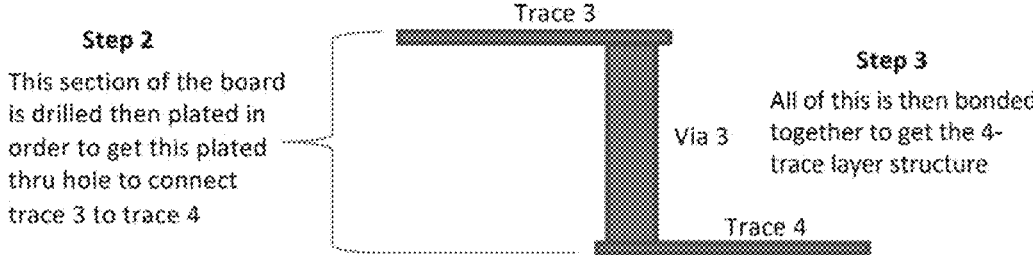

Step 2

This section of the board is drilled then plated in order to get this plated thru hole to connect trace 3 to trace 4

Step 3

All of this is then bonded together to get the 4-trace layer structure

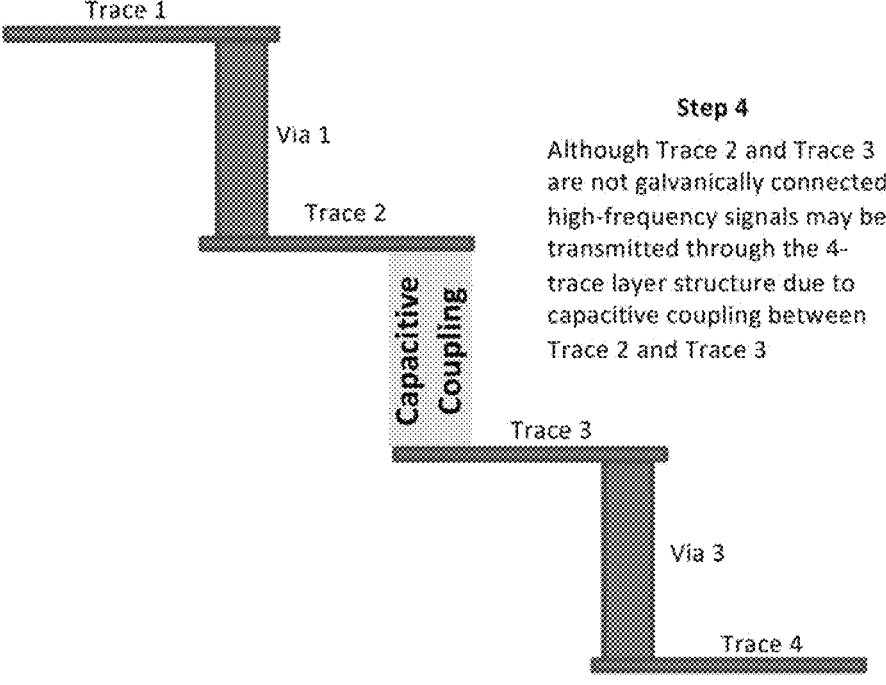

Step 4

Although Trace 2 and Trace 3 are not galvanically connected, high-frequency signals may be transmitted through the 4-trace layer structure due to capacitive coupling between Trace 2 and Trace 3

FIG. 7B

QUASI-HELICAL ANTENNAS AND ASSOCIATED MANUFACTURING METHODS

CROSS-REFERENCES TO RELATED APPLICATIONS

This application is a Continuation-In-Part and claims benefit of PCT/US2021/053003 filed Sep. 30, 2021, which claims benefit of U.S. Provisional Application No. 63/085, 892 filed Sep. 30, 2020, the specifications of which are incorporated herein in their entirety by reference.

BACKGROUND OF THE INVENTION

Field of the Invention

The present invention relates to antenna elements for transmission and reception of data and to methods for the manufacturing thereof, in particular, to end-firing dielectric waveguide antenna elements used in the microwave and millimeter wave frequency bands.

Background Art

Antenna elements are crucial components of telecommunication systems, providing the function of radiating and receiving radio frequency energy that encodes data and voice communication. Antenna elements may be constructed in many different configurations utilizing well known methods and materials including metallic wire, dielectric materials, and printed circuit (Printed Circuit Board or PCB).

Antenna elements may be used to efficiently radiate and receive electromagnetic energy into free space, from a system that otherwise generates or confines its electromagnetic energy. An antenna element that radiates electromagnetic energy equally in all spatial directions in three-dimensional space may be deemed an isotropic radiator. By contrast, in certain applications it is advantageous to create an anisotropic radiator, one which may largely confine the radiation to within a narrow beam or region in a specific desired direction. Confinement of the beam within a narrow region of solid angle (beamforming) may be accomplished by configuring the geometry of the antenna element itself, the materials and methods of its construction, as well as by reflective and refractive focusing in the near field of the antenna element.

Wireless communication networks in general, and networking equipment such as is utilized in 5G communications in particular, may demand a ubiquity of antennas to connect one wireless communication station to another (e.g. stations termed Multiple Input Multiple Output, or MIMO), by electromagnetic radiation, through the free space medium. Sophisticated radiating structures may be necessary, structures whose pattern of radiation may be highly configurable in region, direction, polarization, and power level. The creation of these sophisticated radiating structures may require an amalgamation of many individual antennas. The antennas' function may be: to radiate electromagnetic energy efficiently at their design center frequency; and, to radiate in a well-defined direction, within a well-defined extent of solid angular space. In addition to radiating, these antennas likewise may receive radiation with similar properties. Dielectric waveguide antennas may meet said criteria demanded of individual antennas; moreover, they may do so with a great economy of power consumed. The term "dielectric waveguide antenna" may describe a rod antenna that may employ a structural dielectric of high relative permittivity, for the purpose of aiding in shaping the antenna's radiation pattern. These structural dielectrics may be organic polymer matrices, and may be amenable to machining, such as drilling, milling, and lathe turning.

Antenna designs, particularly those constructed of helical wires encapsulated in dielectric structures are difficult and time-consuming to construct to the precision required for efficient radio frequency signal transmission and reception. Using materials such as wire and manufacturing techniques for forming helical structures and positioning them within the reset of the system may be very imprecise and time consuming. The lack of precision may decrease antenna efficiency and center frequency accuracy which are key parameters that affect producing capability, yield, cost, and accuracy. The issues inherent in the helical construction techniques may result in difficult manufacturing with very low success rate (yield) making it impractical for the large number of antennas that may be required antenna system designs that utilize multiple antennas for a completed transmission and reception system.

Antenna designs implemented using PCB methods and materials have been reported. Examples of PCB implemented antenna designs include loop, patch, inverted-F, meander line, and slot antennas. These antennas are generally simple in design, and are generally restricted to noncircular polarization radio frequency energy. There exists a need for high precision, circularly polarized dielectric waveguide antennas which may be efficiently manufactured on a large scale.

BRIEF SUMMARY OF THE INVENTION

It is an objective of the present invention to provide devices and methods that allow for the mass manufacture of dielectric waveguide antennas that may employ quasi-helical antenna elements, as specified in the independent claims. These quasi-helical elements replicate the properties of the standard helical antenna elements to a high degree. Embodiments of the invention are given in the dependent claims. Embodiments of the present invention can be freely combined with each other if they are not mutually exclusive.

This invention is unique and surprising since it allows for the PCB methods and materials to create antenna elements that are configured to transmit and receive circularly polarized radio frequency energy in radio frequency bands with high efficiency.

The present invention features methods for creating dielectric waveguide antenna components that may be fabricated within standard planar printed circuit board manufacturing processes, as well as methods for locating dielectric waveguide antenna components within a structure and utilizing machining techniques to transform those components into a completed antenna assembly with final finished dimensions as dielectric waveguide antennas. The present invention also features quasi-helical antennas embedded within dielectric waveguide antenna blanks. The term "quasi-helical" refers to the property of having the shape approximating a helical geometry, where a quasi-helix may be a straight line approximation to a smooth helix. Whereas, for instance, a smooth helix may be observed as the thread on a screw, a quasi-helix may be observed as the stairs within a stairwell (among other possible embodiments). Each complete wrap by the quasi-helix around its central axis may be deemed a 'period' of the quasi-helix. A quasi-helix of arbitrary length may be formed from a chain of cascading, identical, quasi-helical periods, the end periods of which may be incomplete. In the preferred embodiment of the present invention, the cross-section of the quasi-helix, as fabricated within a printed circuit board, may be rectangular (e.g. square). In the preferred embodiment of the present invention, the cross-section of the dielectric waveguide antenna blank may also be about rectangular, while the cross-section of the dielectric waveguide antenna may be about circular. The circular cross-section may be formed using machining techniques such as turning on a lathe or milling using a 3-D mill. The cross-section of the dielectric waveguide antenna may taper along its length or may maintain a constant cross-section along its length. As used herein, "suitable dielectric" refers to a material whose relative dielectric properties are such that the material is suitable for the fabrication of a dielectric waveguide antenna. As a non-limiting example, a "suitable dielectric" may be a printed circuit board material with a relative dielectric constant in the range of about 2.0 to 10.0 or the range of about 2.5 to 4.5. As another non-limiting example, a "suitable dielectric" may be a printed circuit board material with a relative dielectric constant in the range of about 3.0 to 3.5. For the purposes of calculation in the examples herein, it is assumed that the dielectric material has a relative dielectric constant of 3.0.

Typically, a truly helical antenna shape is formed by winding a solid wire around a circularly cross-sectioned mandrel, at a well-defined pitch. One of the unique and inventive technical features of the present invention is replacement of such a helical element with one having a quasi-helical antenna shape. The quasi-helical antenna shape may have a rectangular cross-section when viewed along the central axis of the quasi-helical antenna. Without wishing to limit the invention to any theory or mechanism, it is believed that the technical feature of the present invention advantageously provides for excitation of a circularly polarized electromagnetic beam propagating along the central axis. None of the presently known prior references or work has the unique inventive technical feature of the present invention. Furthermore, prior references and designs teach away from the present invention. For example, the teaching of the art is that a helical antenna should have a circular cross-section. This is because of the practical advantages of forming a helical antenna by wrapping a rigid wire around a circular mandrel. For example, circular mandrels are readily available and may release the formed wire without snagging. Additionally, when forming a helical antenna by wrapping a wire around a circular mandrel, there are no corners that may focus mechanical strain unevenly during forming.

Furthermore, the inventive technical features of the present invention contributed to a surprising result. The electromagnetic simulation of a quasi-helical antenna has shown that a quasi-helical antenna shape may approximate a truly helical shape sufficiently, at a given design center frequency, so as to excite a circularly polarized electromagnetic beam propagating along the central axis, provided that the geometry of the quasi-helix may be appropriately chosen.

Another of the unique and inventive technical features of the present invention is the compatibility of the quasi-helical antenna shape with standard planar printed circuit board manufacturing processes. Without wishing to limit the invention to any theory or mechanism, it is believed that the technical feature of the present invention advantageously provides for the mass production of rod antennas without dedicated tooling. Further, the printed circuit board technique and manufacturing process may be much more repeatable from unit to unit than may be obtainable from encapsulating a helically formed wire, which in turn may eliminate the need for any tuning or adjustment of the completed antenna device in order for it to operate within required specifications. Once the design has been proven, the performance of each and every unit constructed afterwards may faithfully duplicate that of the original unit. None of the presently known prior references or work has the unique inventive technical feature of the present invention. Furthermore, the prior references and designs teach away from the present invention. For example, a truly helical antenna shape may be formed by winding a solid wire around a circularly cross-sectioned mandrel at a well-defined pitch, but this operation may require tooling dedicated to the task and difficult construction and manufacturing process with low product yield, and hence the capital equipment required to produce truly helical antennas at the desired production rate may be unavailable in the short run, or conversely may lie idle in times of overcapacity. The printed circuit board manufacturing process may be, by contrast, undifferentiated with respect to the tooling required to produce many varieties of unrelated electrical circuits, and hence its manufacturing capacity may be widely implemented using industry-standard techniques, materials, and processes. Furthermore, the inventive technical features of the present invention contributed to a surprising result. The quasi-helical antenna may be precisely buried within the printed circuit board by laminating additional non metallized dielectric lamina upon it, a step which may require no separate manufacturing process. This positions the quasi-helical structure precisely within the antenna system. In the case of a dielectric waveguide antenna, the dielectric both within the quasi-helical antenna and outside of it contributes to the dielectric waveguide antenna's electromagnetic performance. Consequently, the printed circuit board process may be convenient for the manufacture of dielectric waveguide antenna blanks and may allow for precise alignment of the antenna element within the encapsulating dielectric material. For example, when the electrically active element of a dielectric waveguide antenna is formed from a rigid solid wire, and then encapsulated by a thermosetting resin within a mold, care may be demanded to be taken to orient and center the electrically active element so as to align its central axis with the long axis of the mold, as well as care to mitigate any distortion of the helix induced by a non-uniform expansion or contraction of the resin during its curing. In contrast, the methods of the present invention allow for efficient and precise positioning of the active element within the encapsulating material. The invention may allow for efficient manufacturing and assembly processing with very precise performance characteristics, Another of the unique and inventive technical features of the present invention is non-galvanic (e.g. capacitive and/or inductive) coupling between semi-periods of the quasi-helix. This surprising feature may eliminate the need for additional manufacturing techniques such as the construction of buried or hidden vias. Without wishing to limit the invention to any theory or mechanism, it is believed that the technical feature of the present invention advantageously provides for the avoidance of cumbersome buried or hidden via structure, one whose realization may be highly variable and involves additional manufacturing processes and hence may induce unfavorable mechanical and electrical performance variations among manufactured units. Otherwise: there would be a need for a buried via type in the center of the printed circuit board (PCB) that connects exactly two buried foil layers; this would cause the need to drill through the entire PCB everywhere the two foil layers require connection; then the vias so drilled would need to be plated through; then there would need to be a precisely depth-stopped counterboring operation of each such via, from each side of the board, to remove the plated-through via stub where it stands proud of the two foil layers requiring connection; and then finally the counterbores would need to be filled completely with suitable uncured dielectric paste. None of the presently known prior references or work has the unique inventive technical feature of the present invention. Furthermore, the prior references teach away from the present invention. For example, by way of emulating the topology of a helical wire antenna, a semi-helical antenna conductor structure implemented within a printed circuit board might employ a single, continuous conductor structure, and therefore would demand galvanic connection between all adjacent conductive segments. The admission of capacitive coupling between adjacent field segments, by contrast, may obviate the need for their galvanic connection where it may be cumbersome, without ill effect upon electrical performance.

Furthermore, the inventive technical features of the present invention contributed to a surprising result. For example, when a plurality of dielectric waveguide antenna blanks may be fabricated by integrating a quasi-helical antenna within a printed circuit board sub-assembly, and the quasi-helical antenna precisely buried within the printed circuit sub-assembly by laminating further non metallized dielectric lamina upon it, the resulting printed circuit board assembly's standard panel size may accommodate many instances each. Then, when a plurality of dielectric waveguide antenna blanks may be extracted from the panel by milling through their respective boundaries, each blank may be further processed using techniques such as lathe-turning, from a rectangular cross-section, to a round one. In that case, the repeatability of the finished result may depend in part upon how true, or how devoid of warping, the dielectric waveguide antenna blanks themselves may be initially. Printed circuit board manufacturing techniques and layer construction such as utilizing an even number of metallized layers which may warp less upon completion of processing than do printed circuit boards with an odd number of layers Additionally, the pairing of like metallized dielectric cores within a printed circuit board (PCB) may be chosen such that any tendency of a first core to warp in one direction is complemented by the tendency of its opposite core to warp in the opposite direction, with the net result that warping be so mitigated in the composite assembly. Consequently, four layers of metallization may be preferable to three for many types of printed circuit, but then the fabrication of buried vias joining only the two innermost metal layers may become difficult. Surprisingly, these vias may have been found during electromagnetic simulation to be unnecessary, due to capacitive coupling between these innermost layers, and therefore the problem avoided.

An additional feature for processing using lathe-turning for precise construction is the inclusion of one or more datum holes. These datum holes provide for positioning or fixturing the antenna PCB and may provide exact position within the lathe process for dimensional consistency.

Any feature or combination of features described herein are included within the scope of the present invention provided that the features included in any such combination are not mutually inconsistent as will be apparent from the context, this specification, and the knowledge of one of ordinary skill in the art. Additional advantages and aspects of the present invention are apparent in the following detailed description and claims.

BRIEF DESCRIPTION OF THE SEVERAL VIEWS OF THE DRAWINGS

The features and advantages of the present invention will become apparent from a consideration of the following detailed description presented in connection with the accompanying drawings in which:

FIG. 4B shows a representative cross-section of the layup of the multi-layer printed circuit of FIG. 4A, and indicates some of the multilayer printed circuit's constituent dielectric substrates, conductive segments, and vias perpendicular to the surface, in addition to the location of the central axis within and parallel to the surface.

FIG. 7A shows an illustration of the steps required to fabricate a buried via between the innermost two trace layers (Trace 2 and Trace 3) of a four-layer printed circuit board. The process involves first creating a through via, then counterboring away all of it, except the vestigial stubs of Trace 2 and Trace 3. The pentagons represent the profiles removed by counterboring bits having pointed tips, which must stop short of Trace 2 and Trace 3 in order to maintain the buried via's integrity.

FIG. 7B shows an illustration of the steps required to fabricate a structure similar to the one shown in FIG. 7A utilizing the capacitive coupling to eliminate the inner layer vias.

DETAILED DESCRIPTION OF THE INVENTION

Figure 4A:
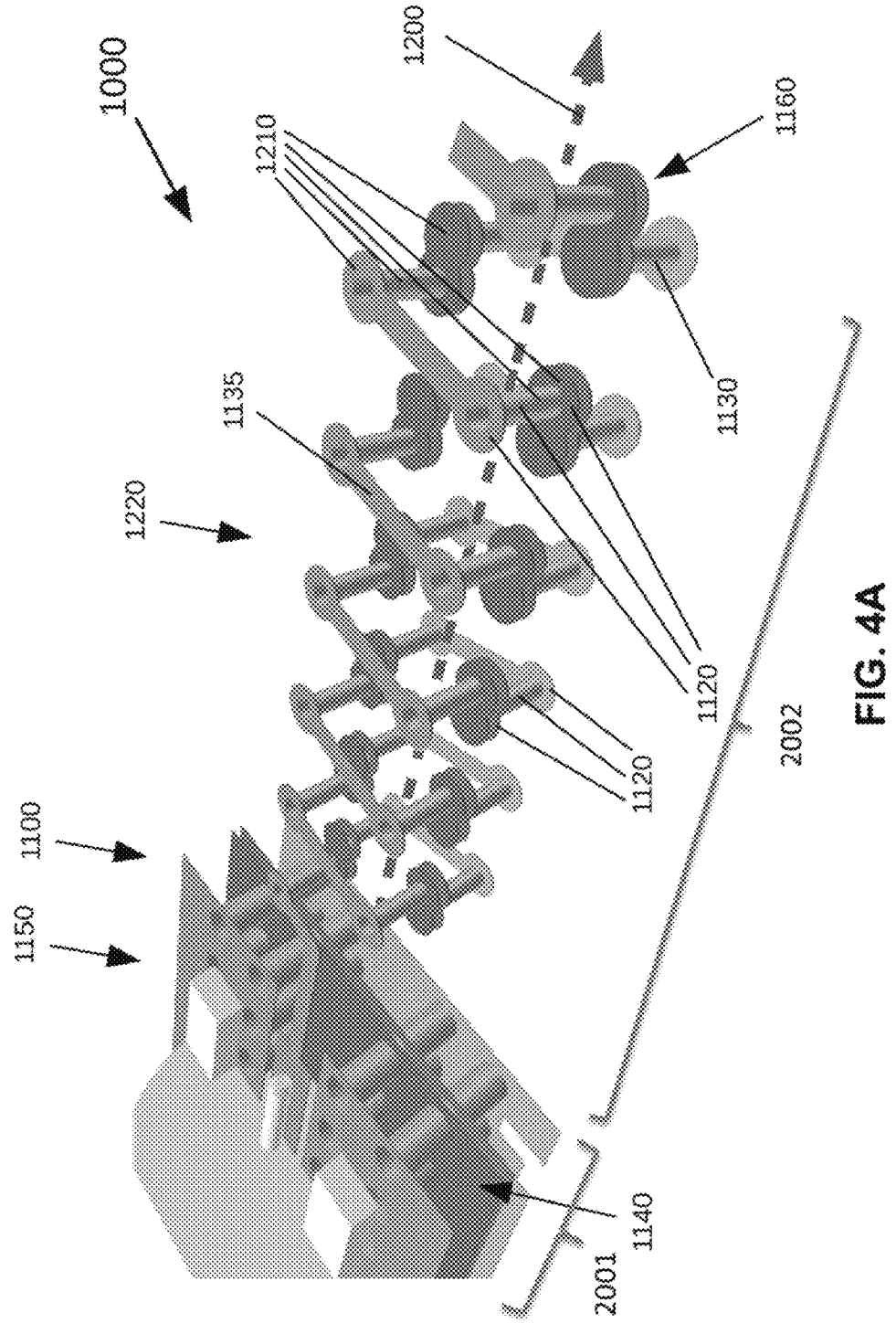
FIG. 4A shows the electrical conductor structure of a quasi-helical antenna (1000), as realized in a multi-layer printed circuit, and formed about a central axis that lies parallel to the surface of the multi-layer printed circuit board (PCB).

Following is a list of elements corresponding to a particular element referred to herein:

100 capacitively coupled quasi-helix
121 first metal foil
122 second metal foil
123 upper structural dielectric
141 upper trace
142 upper trace entrance end
143 upper trace exit end
161 second metal exit landing
181 second metal entrance landing
201 upper exit via
221 upper entrance via
241 third metal foil
242 fourth metal foil
243 lower structural dielectric
261 third metal exit landing
281 third metal entrance landing
301 lower trace
302 lower trace entrance end
303 lower trace exit end
321 lower exit via
341 lower entrance via
360 prepreg dielectric
600 printed circuit structure
610 pair of mechanical datum holes
611 first mechanical datum hole
612 second mechanical datum hole
621 first edge
622 opposite edge
631 first lathe center
632 second lathe center
1000 antenna
1100 printed circuit board (PCB)
1110 substrate
1120 conductive segment
1130 via
1135 trace
1140 surface
1150 multi-layer printed circuit
1160 parallel plate capacitor
1200 central axis
1210 half-period
1220 chain
2001 antenna feed structure
2002 quasi-helical antenna structure Referring now to FIGS. 4A and 4B, the present invention features a quasi-helical antenna (1000) that may comprise a plurality of substantially straight conductive segments (1120), sequentially arranged around a central axis (1200) in a periodic, repeating, quasi-helical arrangement. The quasi-helical antenna as illustrated in FIG. 4A may be fabricated within a standard printed circuit board manufacturing process comprising four metal foil layers. The metal foil layers may be laminated upon one or both broad surfaces of sheet dielectric lamina of various thicknesses, as in FIG. 4B, before the foil layers may be patterned into useful geometries by photolithographic methods. Since the sheet dielectric lamina may be nearly two-dimensional, the term "surface" as it may be used within this document may refer to either of the broad, parallel, surfaces of the sheet dielectric lamina upon which the metal foil layers may be laminated.

The representative cross-section of the printed circuit board shown in FIG. 4B may demonstrate that four varieties of vias, three of which may be buried vias, may be possible in the example embodiment. The term "via" may refer to accurately placed and sized holes drilled through the surfaces of the sheet dielectric lamina at various steps during their composition into an entire multi-layer printed circuit board, and subsequently plated through with electrical conducting inner surfaces for the purpose of creating an electrically conducting path between a patterned geometry on some first metal foil layer, and some other patterned geometries on some other metal foil layers. These geometries, patterned within a given metal foil layer by photolithographic methods, may be referred to by the term "traces".

To avoid technical difficulties during the manufacture of the entire multi-layer printed circuit, the buried vias may be created by drilling entirely through various sub-assemblies of patterned dielectric lamina; buried vias are not permitted to penetrate the outermost surfaces of the multi-layer printed circuit, by definition. Therefore, the creation of the four varieties of vias as shown in FIG. 4B may be performed during four different steps, upon four different sub-assemblies of dielectric lamina. The vias, which may be defined by a drilling operation through the surfaces of the dielectric lamina, may necessarily be substantially straight conductive segments, while the traces may be substantially straight conductive segments, if not necessarily so. The entire collection of traces and vias, conductive segments, may constitute a chain that may wrap around the central axis that may lie about parallel to the surfaces of the dielectric lamina. If the quasi-helical antenna radiates electromagnetic energy efficiently into free space at some frequency or frequencies, when excited by some source of electromagnetic energy at one of those frequencies, it may be deemed to function as an antenna.

Referring now to FIG. 4A, each conductive segment (1120) may be electrically coupled to the adjacent conductive segments (1120) in the sequence so as to form an antenna (1000) configured to emit or receive electromagnetic energy as a beam or region aligned with the central axis (1200). The term "electrically coupled" may denote one of an intimate mechanical connection between two conductive segments such that direct electrical currents may flow freely between them, or, electromagnetic coupling of energy between two disjoint conductive segments by means of electric, magnetic, or electromagnetic fields, such that electromagnetic energy may be guided by the conductive segments. Field couplings may take the form of parallel plate capacitors, in the case of quasi-static electric field coupling, or coupled transformer windings, in the case of quasi-static magnetic field coupling, or some other electromagnetic coupling. When the electrical coupling between two conductive segments may be by any other means than an intimate mechanical connection, the electrical coupling may be deemed to be "galvanically isolated" for convenience of reference. It may be possible to choose a geometry for the plurality of conductive segments such that they may constitute an antenna that may efficiently radiate a defined region or directional beam of electromagnetic energy— which may be circularly polarized—primarily along the central axis of the antenna, at a given design operating frequency, or center frequency, of excitation. The emission of said circularly polarized beam may be confirmed by an electromagnetic simulation of the antenna geometry, by measurement of a fabricated instance of the antenna geometry, or by both. Complex antenna geometries constructed from conductive segments may evade any analytical closed-form that may be readily amenable to optimization. Hence, the efficacy of said antenna may be surprising.

In some embodiments, the conductive segments (1120) may be arranged around the central axis (1200) in a square helix arrangement. The term "square helix" may denote that the helix, when viewed along its central axis, may reveal a cross-section that is about rectangular or may approximate a square. In some embodiments, two or more of the conductive segments (1120) may be capacitively coupled. This may occur, for instance, where a parallel plate capacitor (1160) is formed within the multi-layer printed circuit by overlapping traces, and may be enhanced by the presence of a comparatively thin intervening dielectric lamina. FIG. 4A illustrates such a case.

In some embodiments, two or more of the conductive segments (1120) may be conductively coupled. Conductive coupling, by contrast with the case of galvanic isolation, may be the most common means of electrically coupling two conductive segments, and may necessarily involve an intimate mechanical connection between the conductive segments. Vias within a multi-layer printed circuit, for instance, may conductively couple traces on separate layers by means of an intimate mechanical connection.

In some embodiments, the conductive segments (1120) may form a plurality of half-periods (1210). A half-period of a quasi-helix may wrap its central axis by about 180 degrees. The example half-period indicated in FIG. 4A may include all conductive segments that may be joined by conductive coupling, and may be divided from its closest neighboring half-periods by parallel-plate capacitors (1160).

In some embodiments, the plurality of half-periods (1210) may be joined by parallel-plate capacitors (1160). To the extent that the quasi-helical antenna (1000) may be viewed as a chain (1220), and that the head of any given half-period may be further wound about central axis (1200) than the tail of any given half-period, the plurality of half-periods may be joined head-to-tail by parallel plate capacitors.

Referring now to FIGS. 4A and 4B, in some embodiments, the conductive segments (1120) may be patterned within a stack of printed circuit boards (PCB) (1100). A PCB may be composed from constituent PCB sub-assemblies, since any dielectric lamina bearing patterned metal foil on one or both of its surfaces may itself be a PCB sub-assembly, and these PCB sub-assemblies may be themselves stacked and laminated together to form a multi-layer printed circuit, or PCB. In FIG. 4A, the conductive segments may consist of traces and vias patterned within a stack of PCBs.

In some embodiments, some of the conductive segments (1120) may comprise traces (1135) on surfaces (1140) of the PCBs and some of the conductive segments (1120) may comprise vias (1130) between the surfaces (1140) of the PCBs. Traces and vias may constitute two varieties of conductive segment, within the context of a PCB, and both varieties may be employed to compose a quasi-helical antenna (1000). The conductive segments (1120) may be patterned within a stack of printed circuit boards (PCB) (1100). One or more of the conductive segments (1120) may comprise one or more traces (1135) on one or more surfaces (1140) of one or more PCBs of the stack of PCBs (1100) and one or more of the conductive segments (1120) comprise one or more vias (1130) between two or more surfaces (1140) of two or more PCBs of the stack of PCBs (1100).

In some embodiments, the central axis (1200) may be parallel to a plane of each PCB within the stack, and the quasi-helical antenna (1000) may be configured to emit or receive the electromagnetic energy as a beam or region from an end of the stack. The notion of an axis parallel to a plane may mean that the axis may never intersect the plane, and that the axis therefore is not permitted to lie within the plane. The plane of a PCB may designate the surface of said PCB, namely either of the broad, parallel, surfaces of the sheet dielectric lamina upon which the metal foil layers may be laminated.

In some embodiments, a geometry of the repeating quasi-helical arrangement may be configured in periodic pitch and cross-section to radiate electromagnetic wave power efficiently along the central axis (1200) at a center frequency. An efficient antenna operating about a center frequency within the microwave Ka-band may employ a PCB layup such as in FIG. 4B, for instance. By contrast, the same geometry and materials, when employed at other frequencies of excitation, may radiate inefficiently, may radiate in modes other than primarily circularly polarized, and may radiate primarily other than along the central axis.

In some embodiments, the center frequency may reside within any of microwave L-band, S-band, C-band, X-band, Ku-Band, K-band, Ka-band, V-Band or W-band. L-band may include electromagnetic radiation in frequencies in the range from 1 GHz to 2 GHz. S-band may include electromagnetic radiation in frequencies in the range from 2 GHz to 4 GHz. C-band may include electromagnetic radiation in frequencies in the range from 4 GHz to 8 GHz. X-band may include electromagnetic radiation in frequencies in the range from 8 GHz to 12 GHz. Ku-band may include electromagnetic radiation in frequencies in the range from 12 GHz to 18 GHz. K-band may include electromagnetic radiation in frequencies in the range from 18 GHz to 27 GHz. Ka-band may include electromagnetic radiation in frequencies in the range from 27 GHz to 40 GHz. V-band may include electromagnetic radiation in frequencies in the range from 40 GHz to 75 GHz. W-band may include electromagnetic radiation in frequencies in the range from 75 GHz to 100 GHz.

In some embodiments, the vias (1130) may be perpendicular to the surfaces (1140) of the PCBs or angled between the surfaces (1140) of the PCBs. Commonly in PCB manufacture, vias may be drilled perpendicular to the PCB surface, and therefore may be perpendicular to any central axis (1200) that may lie parallel to the PCB surface. FIG. 4A may show staggered placement of hidden or blind vias, as a staircase approximation to the linear quasi-helical pitch gained by the traces along the PCB surface. Said traces may lie skew to any given central axis parallel to the PCB surface, yet without the traces' necessarily being perpendicular to the central axis. Conceivably, vias may be drilled other than perpendicular to the PCB surfaces, such that the vias themselves may lie skew to any given central axis parallel to the PCB surface, yet without being perpendicular to the central axis. Such an arrangement may obviate the utility of staggered via placement toward the attainment of quasi-helical pitch. A smoother and more uniform quasi-helical pitch may promote a more compact beam of electromagnetic energy from the antenna (1000).

In one embodiment, a method of forming a quasi-helical antenna (1000) may comprise: providing a plurality of planar printed circuit board (PCB) substrates (1110); patterning each of the PCB substrates (1110) with a plurality of electrically conducting traces (1135) and a plurality of electrically conducting vias (1130); and, joining the PCB substrates (1110) to form a multi-layer printed circuit (1150). The PCB substrates may be joined by laminating their surfaces to one another in a layup such as in FIG. 4B. During this step in PCB manufacture, reliable methods of registering the alignment of each substrate to each of the others may be undertaken. In other words, the placement of the vias and traces with respect to each other within a PCB may be presumed to lie within a specified accuracy, mechanically. Said accuracy may be determined by the PCB manufacturer's process capability. Knowledge of this accuracy may be exploited during any subsequent milling or machining of the PCB. Consequently, mechanical features of the completed PCB may be accurately registered with respect to the electrically functional conductive segments within the PCB.

In some embodiments, the multi-layer printed circuit (1150) may comprise a periodic quasi-helical chain (1220) of the traces (1135) and vias (1130), and the chain (1220) may be arranged about a central axis (1200), which may be parallel to each of the PCB substrates (1110). Tangibly, an embodiment of the quasi-helical antenna (1000) may be so expressed.

The periodic quasi-helical chain (1220) may be configured to emit or receive electromagnetic energy as a beam or region which may be aligned with the central axis (1200). It may be possible to choose a geometry for the quasi-helical chain such that it may constitute an antenna that may efficiently radiate a beam of electromagnetic energy—which may be circularly polarized—primarily along the central axis of the antenna, at a given design operating frequency, or center frequency, of excitation. The emission of said circularly polarized beam may be confirmed by an electromagnetic simulation of the antenna geometry, by measurement of a fabricated instance of the antenna geometry, or by both. Complex antenna geometries constructed from conductive segments may evade any analytical closed-form that may be readily amenable to optimization. Hence, the efficacy of said antenna may be surprising.

The periodic quasi-helical chain (1220) may comprise an alternating sequence of the electrically coupled traces (1135) and vias (1130). In some embodiments, the periodic quasi-helical chain (1220) may comprise a plurality of electrically coupled conductive segments (1120). Vias (1130) and traces (1135), as shown in FIG. 4A, may be conductive segments.

In some embodiments, the conductive segments (1120) may be coupled by parallel-plate capacitors (1160). The parallel-plate capacitors in FIG. 4A may be intentionally formed between the second and third metal foil layers, wherein the intervening dielectric lamina in FIG. 4B may be chosen to be thin so as to enhance electric field containment within said parallel-plate capacitors.

In some embodiments, the parallel-plate capacitors (1160) may be formed by alignment of the traces (1135). The traces in the second and third metal foil layers may coincide about entirely in plan view, so as to enhance their parallel-plate capacitors. The term "plan view" may designate a projected view of the PCB lamina such that geometric features patterned into the metal foils laminated to the lamina may be similar to their projections. As used in the prior sentence, the term "similar" may be defined as geometrically congruent, given an appropriate scale factor. In some embodiments, the multi-layer printed circuit (1150) may comprise two or more layers of traces (1135) and one or more layers of vias (1130).

In some embodiments, the periodic quasi-helical chain (1220) may be configured in periodic pitch and cross-section to radiate electromagnetic wave power efficiently along the central axis (1200) at a center frequency. The periodic quasi-helical chain may be an antenna, and may emit a circularly polarized beam along its central axis.

Figure 5A:
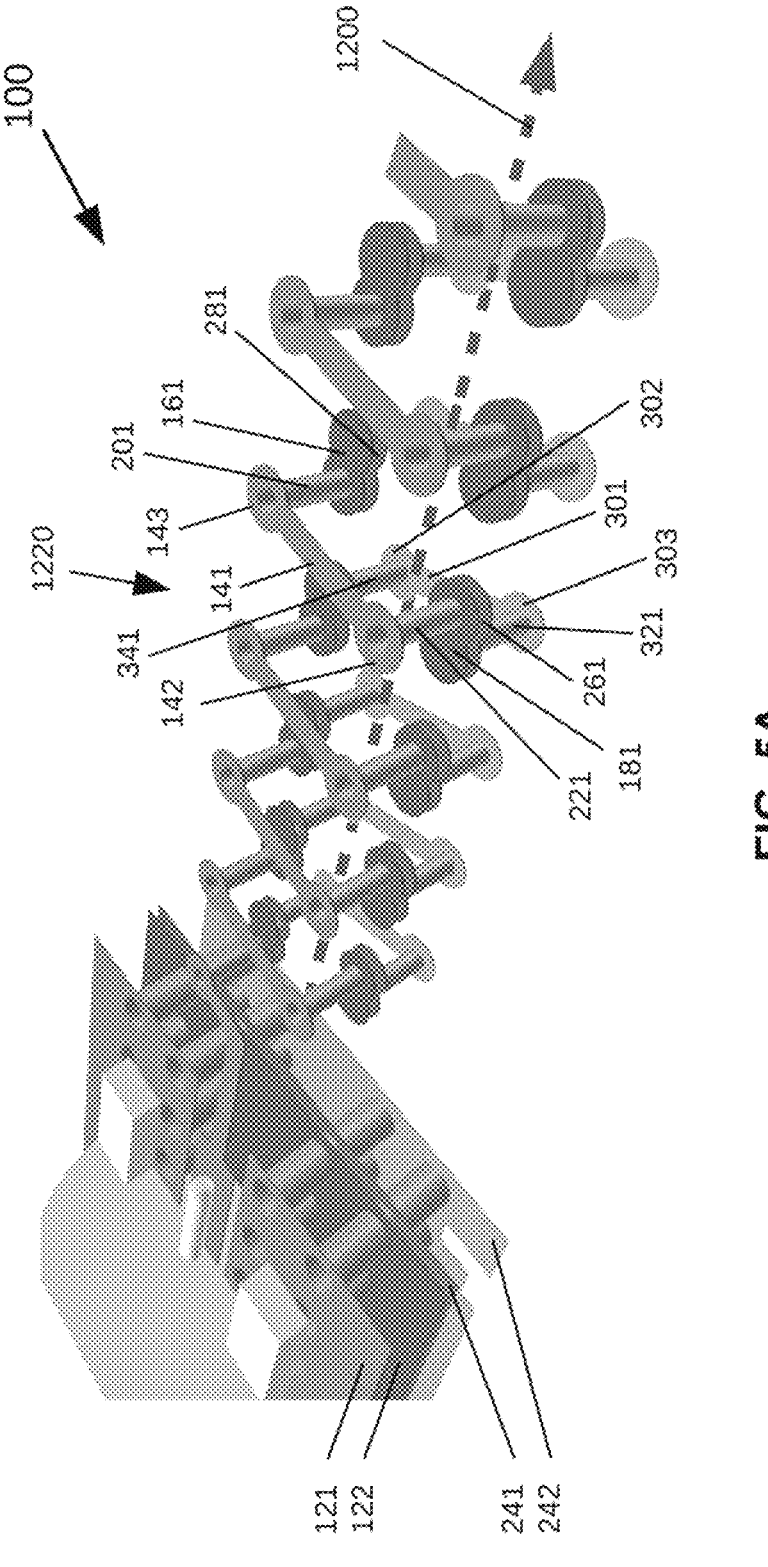
FIG. 5A shows the detailed construction of a capacitively coupled quasi-helix wound about its central axis in a composition that may employ various named traces patterned within various of: a first metal foil, a second metal foil, a third metal foil, and a fourth metal foil. Various named vias may join traces within the first metal foil to traces within the second metal foil, while other various named vias may join traces within the third metal foil to traces within the fourth metal foil. All of these features are native to planar printed circuit board technology.
Figure 5B:
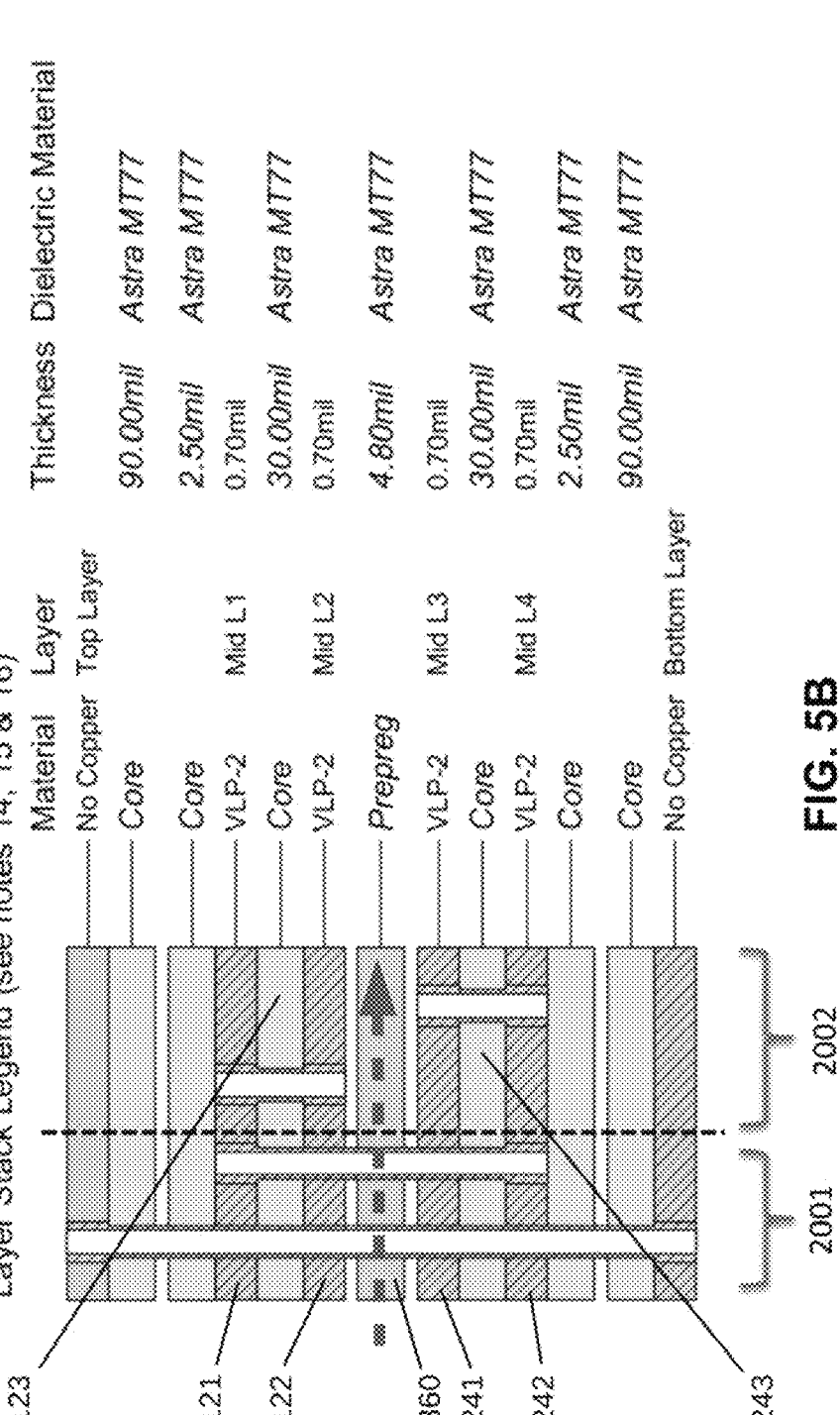
FIG. 5B shows a representative cross-section of the layup of the planar printed circuit board that may carry the capacitively coupled quasi-helix of FIG. 5A. In addition to the various metal foil layers, an upper structural dielectric, a lower structural dielectric, and a central prepreg dielectric are indicated. Portions of the second foil layer may be capacitively coupled to the third foil layer so that inner layer vias are not necessary.

Referring now to FIGS. 5A and 5B, a method for creating a capacitively coupled quasi-helix (100) may comprise: laminating a first metal foil (121) and a second metal foil (122) upon opposite faces of an upper structural dielectric (123); patterning a plurality of upper traces (141) within the first metal foil (121), the upper traces (141) each having an upper trace entrance end (142) and an upper trace exit end (143). The face of a structural dielectric lamina may be coplanar with the surface of a structural dielectric lamina.

The method for creating a capacitively coupled quasi-helix (100) may further comprise: patterning a plurality of second metal exit landings (161) in the second metal foil (122); patterning a plurality of second metal entrance landings (181) in the second metal foil (122). The second metal entrance landings and the second metal exit landings may constitute the upper plates of a plurality of parallel-plate capacitors, whose lower corresponding plates may reside within the third metal foil.

The method for creating a capacitively coupled quasi-helix (100) may further comprise: patterning a plurality of upper exit vias (201), each upper exit via (201) connecting electrically a given upper trace exit end (143) with its respective second metal exit landing (161); patterning a plurality of upper entrance vias (221), each upper entrance via (221) connecting electrically a given upper trace entrance end (142) with its respective second metal entrance landing (181). The electrical connections formed between features in the first metal foil and the second metal foil due to the upper exit vias and the upper entrance vias may be electrically conducting.

The method for creating a capacitively coupled quasi-helix (100) may further comprise: laminating a third metal foil (241) and a fourth metal foil (242) upon opposite faces of a lower structural dielectric (243); patterning a plurality of third metal exit landings (261) in the third metal foil (241); patterning a plurality of third metal entrance landings (281) in the third metal foil (241); patterning a plurality of lower traces (301) in the fourth metal foil (242), the lower traces (301) each having a lower trace entrance end (302) and a lower trace exit end (303). The third metal entrance landings and the third metal exit landings may constitute the lower plates of a plurality of parallel-plate capacitors, whose upper corresponding plates may reside within the second metal foil.

The method for creating a capacitively coupled quasi-helix (100) may further comprise: patterning a plurality of lower exit vias (321), each lower exit via (321) connecting electrically a given lower trace exit end (303) and its respective third metal exit landing (261); patterning a plurality of lower entrance vias (341), each lower entrance via (341) connecting electrically a given lower trace entrance end (302) and the third metal entrance landing (281). The electrical connections formed between features in the third metal foil and the fourth metal foil due to the lower exit vias and the lower entrance vias may be electrically conducting.

The method for creating a capacitively coupled quasi-helix (100) may further comprise: laminating the upper structural dielectric (123) to the lower structural dielectric (243) via an intervening prepreg dielectric (360). The intervening prepreg dielectric may constitute the dielectric separating the plates of the plurality of parallel plate capacitors between the second metal entrance landings and the second metal exit landings, and their corresponding third metal exit landings and third metal entrance landings.

The plurality of second metal exit landings (161) in plan view may about coincide with and electrically couple with the plurality of third metal entrance landings (281), and the plurality of second metal entrance landings (181) in plan view may about coincide with and electrically couple with the plurality of third metal exit landings (261). The electrical coupling between coincident landings may be due to electric field coupling via parallel-plate capacitors, which may span the thickness of the intervening prepreg dielectric. In other words, the half-periods of the capacitively coupled quasi-helix may be galvanically isolated from one another, yet may remain electrically coupled.

The chain (1220), from a given upper trace exit end (143), to its respective upper exit via (201), to its respective second metal exit landing (161), to its respective third metal entrance landing (281), to its respective lower entrance via (341), to its respective lower trace entrance end (302), to its respective lower trace exit end (303), to its respective lower exit via (321), to its respective third metal exit landing (261), to its respective second metal entrance landing (181), to its respective upper entrance via (221), to its respective upper trace entrance end (142) in the subsequent upper trace (141), may create one period of the quasi-helix. The quasi-helix thus formed may function as a quasi-helical antenna, provided that the geometry of the quasi-helix be appropriate to the intended center frequency of operation intended for the quasi-helical antenna.

Figure 6:
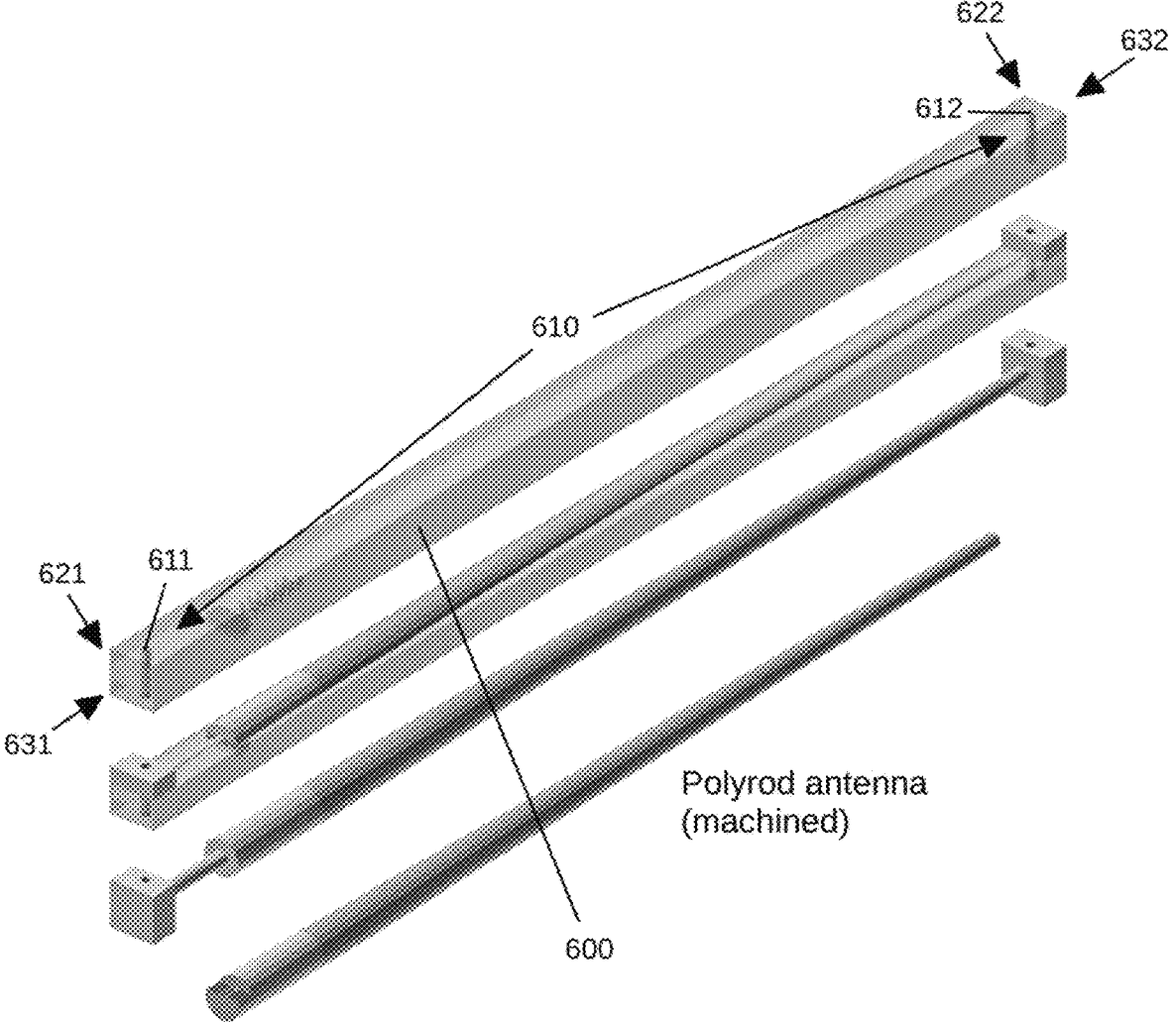
FIG. 6 shows a printed circuit structure that may bear a pair of mechanical datum holes. The mechanical datum holes may be fabricated during the planar printed circuit board fabrication process for accurate mechanical registration with respect to the electrical conductor structures fabricated therein. The mechanical datum holes (610) may subsequently be employed to accurately position the rectangular cross-section of printed circuit structure stock onto lathe centers, for turning the rectangular cross-section into a circular cross-section.

Referring now to FIG. 6, a method for aligning a printed circuit structure (600) within a lathe may comprise: a) creating a pair of mechanical datum holes (610) during printed circuit structure (600) manufacture. Accordingly, due to the process capability of the PCB manufacturing process itself, the location of the pair of mechanical datum holes may be presumed to be accurately located with respect to the electrically functional conducting segments which may be embedded within the printed circuit structure. If the printed circuit structure may be a blank that subsequently may be turned within a lathe to become a dielectric waveguide antenna, then the outer form of the resultant turning must align accurately with the quasi-helical antenna that may be embedded within the blank. In other words, some means may be provided to align the axis of turning to the electrically functional structures buried within the blank. The term "dielectric waveguide antenna" may describe an antenna that employs a structural dielectric of high relative permittivity for the purpose of aiding in shaping the antenna's radiation pattern. The dielectric waveguide antenna, when employed as an end-firing antenna, may shape (beam-form) the antenna's radiation pattern by primarily refractive means. An "end-firing antenna" may emit a beam of electromagnetic energy primarily along its own longest dimension. Hence, both the geometry of the embedded quasi-helical antenna and the geometry of the outer form of the dielectric waveguide antenna may contribute to the shaping and aiming of the beam of electromagnetic radiation emitted, and any variance in the registration between the two, as manufactured, may induce undesirable performance variations from unit to unit within a manufacturing run.

In one embodiment, a first mechanical datum hole (611) may lie closer to a first edge (621) of the printed circuit structure (600) than to an opposite edge (622) of the printed circuit structure (600), and a second mechanical datum hole (612) may lie closer to the opposite edge (622) than to the first edge (621). Since the first mechanical datum hole may be employed to register a lathe center with respect to the first edge, minimizing the distance between mechanical datum hole and the first edge may minimize errors in registration. A similar rationale may motivate the placement of the second mechanical datum hole with respect to the opposite edge.

In some embodiments, the method for aligning a printed circuit structure (600) within a lathe may further comprise: aligning the printed circuit structure (600) with respect to the first lathe center (631), and the first lathe center (631) may be centered in the thickness of the printed circuit structure (600) on its first edge (621), and the first lathe center (631) may be closest to the first mechanical datum hole (611). The thickness of the printed circuit structure may be in a direction transverse to the surfaces, upon which metal foils may be laminated upon the dielectric lamina that may constitute the printed circuit structure. A first point of the lathe turning axis may be defined accordingly.

In some embodiments, the method for aligning a printed circuit structure (600) within a lathe may further comprise: aligning the printed circuit structure (600) with respect to the second lathe center (632), the second lathe center (632) may be centered in the thickness of the printed circuit structure (600) on its opposite edge (622), and the second lathe center (632) may be is closest to the second datum hole. A second point of the lathe turning axis may be defined accordingly, and hence the lathe turning axis completely defined.

In some embodiments, the turning axis of the lathe thereby may coincide with the plane through the pair of mechanical datum holes (610) and the plane bisecting the printed circuit structure (600) in thickness. The metric "about coincide" may denote coincidence within 0.01 mil, 0.1 mils, 1 mil, or 10 mil, where 1 mil is $\frac{1}{1000}$ of an inch. Hence, the lathe turning axis may be accurately registered with respect to the electrically functional structures within the printed circuit structure (600).

Referring now to FIG. 7A and FIG. 7B, it is an additional manufacturing process to create a buried via between the two innermost layers of a printed circuit board. This process may be avoided by capacitively coupling the semi-periods of the quasi-helix. Shown are the steps required to fabricate a buried via between the innermost two trace layers (Trace 2 and Trace 3) of a four-layer printed circuit board. The process involves first creating a through via, then counterboring away all of it, except the vestigial stubs of Trace 2 and Trace 3. The pentagons represent the profiles removed by counterboring bits having pointed tips, which must stop short of Trace 2 and Trace 3 in order to maintain the buried via's integrity. The present invention advantageously provides for the avoidance of a cumbersome buried via structure, one whose realization may be highly variable and hence may induce unfavorable mechanical and electrical performance variations among manufactured units.

Figures 1, 2:
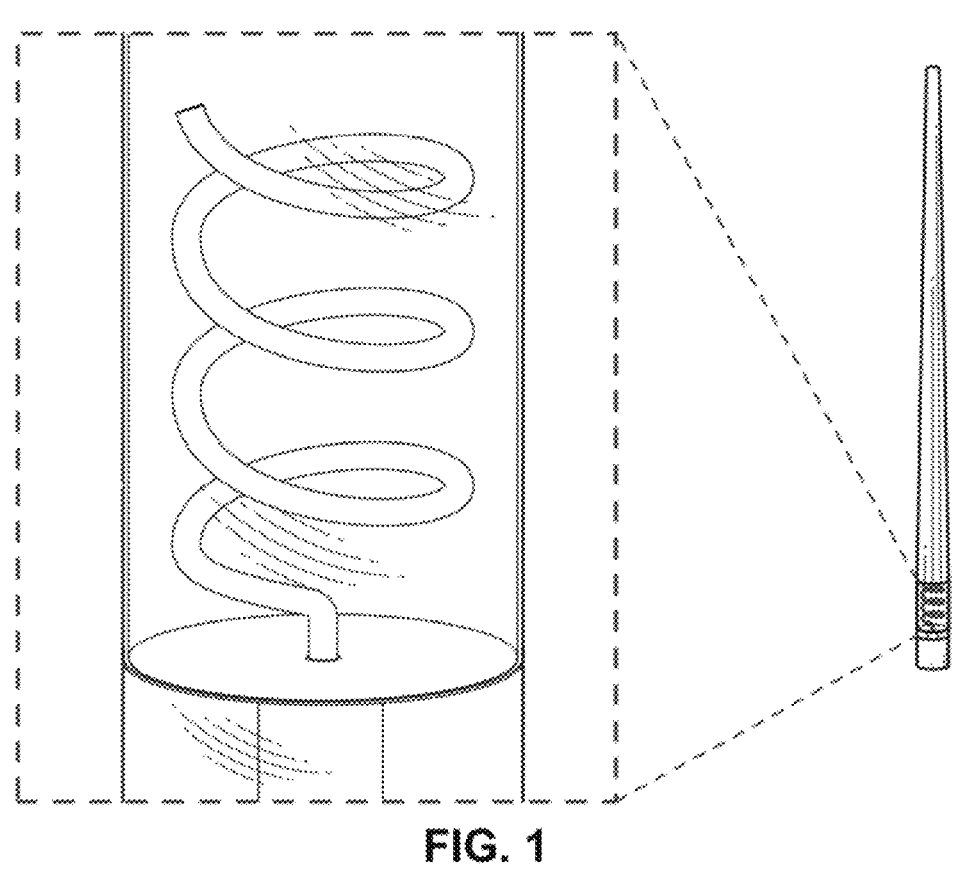
FIG. 1 shows an illustration of the geometry of a dielectric waveguide antenna with a helical antenna element encapsulated within a tapered dielectric material.
FIG. 2 shows an illustration of a normalized radiation pattern for a traditional helical antenna such as the one shown in FIG. 1.
Figure 3:
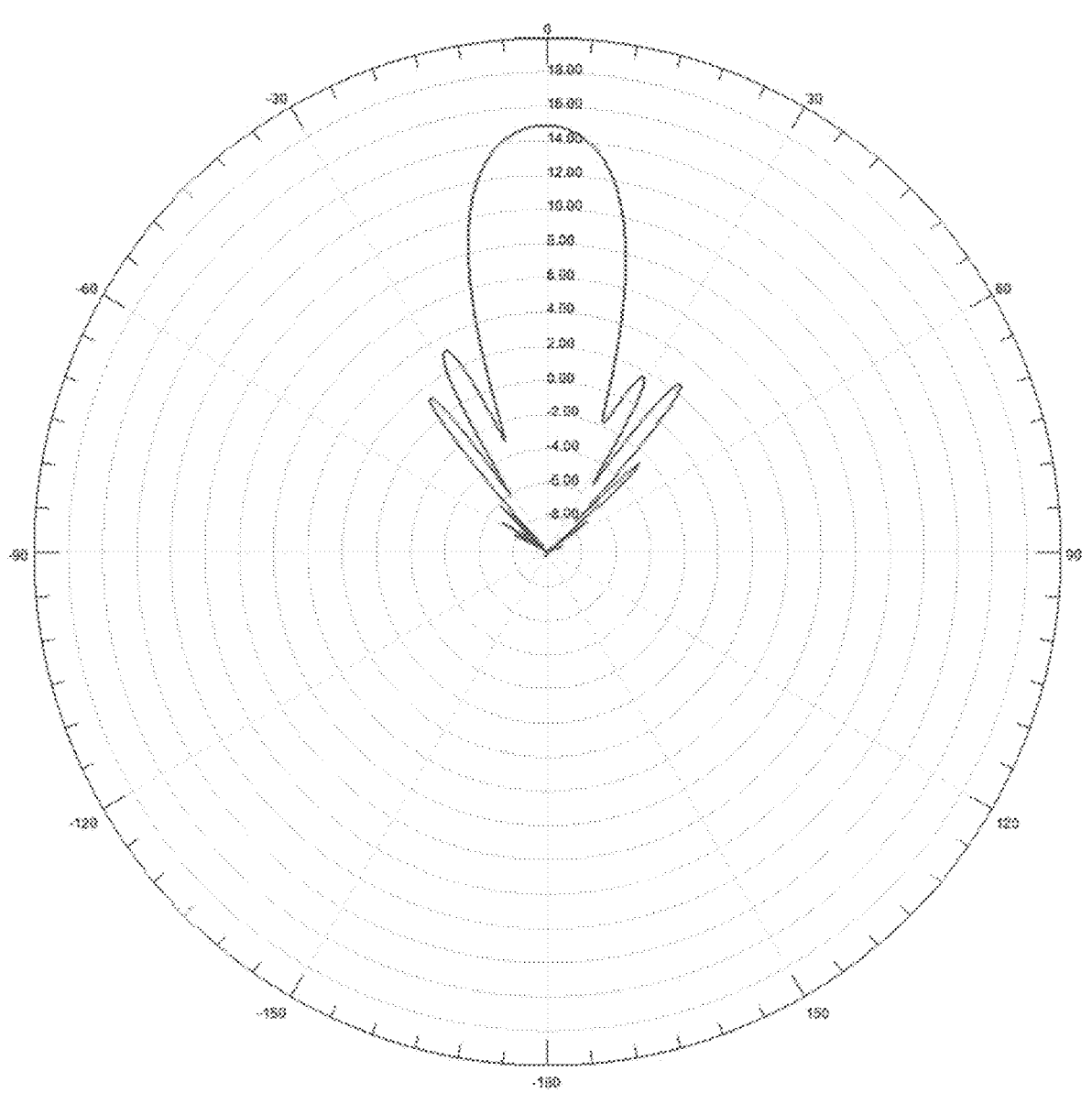
FIG. 3 shows a planar view simulation of the radio frequency energy transmitted by a quasi-helical antenna of the present invention along the primary axis of the antenna.

Referring now to FIG. 4A and FIG. 6, maximizing the return loss observed at the coaxial connector of the dielectric waveguide antenna may contribute positively to the efficiency of the dielectric waveguide antenna. Such tuning may be accomplished with the aid of electromagnetic field simulation software. The coaxial connector may mount to a connector footprint patterned into the same metal layer that constitutes the upper traces of the quasi-helix. The remaining three metal foil layers below the coaxial connector footprint may be all patterned as solid local ground planes, which then may be stitched to the outer conductor terminals of the coaxial connector footprint with a plurality of vias piercing all four layers. This collection of grounded features may constitute an approximation to the backing reflector, such as is designated the ground plane in FIG. 1.

The length and width of the feed trace, from coaxial connector center conductor, to the half an upper trace lead-in to the quasi-helix, may admit sufficient design discretion to accomplish complex conjugate load matching between the quasi-helical antenna and the 50 ohm reference characteristic impedance of an SMPS coaxial connector. For the case of the dielectric waveguide antenna detailed in Example 1 below, the optimal feed trace length may be found to be about half a wavelength at the design center frequency in the suitable dielectric media, or 114 mils, as measured between the backing reflector and the half an upper trace lead-in to the quasi-helix. The dimension of about half a wavelength in the suitable dielectric for the feed trace length may be expected since the quasi-helix antenna may launch traveling waves in both directions along its central axis, and since the reflection of the traveling wave incident upon the quasi-helix from the coaxial connector may be phase shifted by about half a wavelength due traveling to the length of the feed trace, plus a further half a wavelength due to the electric wall boundary condition caused by the backing reflector, with the result that the triple-travel wave traveling toward the tip of the dielectric waveguide antenna may experience constructive interference at the design center frequency. Again for the case of the dielectric waveguide antenna detailed in Example 1 below, the optimal feed trace width may be found to be about 10 mils, which is the same as the width of the upper traces and lower traces of the quasi-helix.

Referring now to FIG. 4A, the number of turns for the quasi-helical antenna may be about 6, since there are 6 complete lower traces, and 5 complete upper traces plus about a half an upper trace of lead-in plus about half an upper trace of lead-out. In other embodiments, the number of turns for the quasi-helical antenna may be 1, 2, 3, 4, 5, 7, 8, 9, 10, 11, 12, 13, 14, 15, 16, 17, 18, 19, 20, 21, 22, 23, 24, 25, 26, 27, 28, 29, 30, or more than 30. The exact length of the lead-out upper trace, which lies at the far end of the quasi-helix, i.e., the end opposite the coaxial feed connector, may be available for design discretion in order to tune the eccentricity of the elliptically polarized electromagnetic wave emitted to be as close to circularly polarized as possible. Such tuning may be accomplished with the aid of electromagnetic field simulation software.

In some embodiments the antenna may include a collar constructed of electrically conductive material surrounding a portion of the antenna structure. This collar may provide shielding or otherwise improve antenna performance. As a non-limiting example, the collar may surround the portion of the antenna structure which includes the input signal feed components and structures (2001) shown in FIG. 4A.

EXAMPLE

The following are non-limiting examples of the present invention. It is to be understood that said examples are not intended to limit the present invention in any way. Equivalents or substitutes are within the scope of the present invention.

Example 1: Production of Dielectric Waveguide Blank with Embedded Quasi-Helical Antenna Step 1: Provide an upper structural dielectric and a lower structural dielectric, each made of a suitable dielectric material and each having a thickness of about 30 mils. This design geometry and choice of materials is for a quasi-helical antenna operating at a center frequency near 29.9 GHZ, whose corresponding free-space wavelength for electromagnetic radiation is about 1 centimeter, or about 394 mils. Since the suitable dielectric material has a relative dielectric constant of about 3, the wavelength in the suitable dielectric corresponding to 29.9 GHz must be the free-space wavelength divided by the square root of the relative dielectric constant of the suitable dielectric (3), which computes to a wavelength of about 227 mils. One way to determine the perimeter of the cross-section of the quasi-helix is to choose it to be about 1 wavelength in the suitable dielectric. Additionally, the cross-section of the quasi-helix is approximately square in aspect ratio. Therefore, the cross-section, on edge, measures about one quarter of a wavelength in the suitable dielectric at the design frequency, or (227 mils)/4, or about 57 mils. Since sheet dielectric material stock comes from a fixed variety of available thicknesses, the closest available thickness to half of the quasi-helix cross-section is chosen, on edge, since essentially the thickness of both the lower structural dielectric and the upper structural dielectric together define the quasi-helix cross-section, on edge, in the direction of the thickness of the printed circuit board. If (57 mils)/2, or 28.5 mil, thick dielectric material is not available, the closest available thickness is chosen, or about 30 mils. Since 30 mils is about 5% greater than the 28.5 mils upon which the design center frequency of 29.9 GHz was predicated due to the perimeter rule above, the design center wavelength has effectively increased by about 5%, with the consequence that the effective design center frequency be divided by about 105%, to about 28.5 GHz.

Step 2: Laminate a first metal foil (121) and a second metal foil (122) upon opposite faces of an upper structural dielectric (123), where each metal foil is made of copper and has a thickness of about 0.70 mils and is finished to VLP-2 surface roughness.

Step 3: Pattern a plurality of upper traces (141) within the first metal foil (121), the upper traces (141) each having an upper trace entrance end (142) and an upper trace exit end (143). Each upper trace comprises a rectangle about 60 mils long and about 10 mils wide, which is inclined at about (90−14.5) degrees, or 75.5 degrees, to the central axis. Each upper trace further comprises a circular via landing (whose radius is about 11 mils) capping each end. The pitch between upper traces also is about 60 mils, which may be expected since each of the upper traces along an edge of the quasi-helix cross-section has an end-to-end pitch of about 14.5 degrees, and since sin (14.5 degrees) is about 0.25, and since there are four segments per edge of the quasi-helix cross-section, which total to about 1.00. The edge dimension of the quasi-helix cross-section along the plane of the upper trace accordingly computes to about (60 mils)*cos(14.5 degrees), or about 58 mils, which is commensurate with the wavelength in the suitable dielectric when the design center frequency is 29.9 GHZ. This dimension of 58 mils, however, is about 5% short of the about 60 mils that were chosen for the quasi-helix thickness due to the availability of dielectric material sheet stock, with the result that the cross-section of the quasi-helix deviates from perfectly square in aspect ratio by about 5% also. In practice, such a deviation from square aspect ratio causes no problems, because the quasi-helical structure generates, in general, an elliptically polarized electromagnetic traveling wave whose eccentricity may be adjusted by tuning the lengths of the final lead-out semi-segment of the quasi-helix, according to the results of electromagnetic simulation.

Step 4: Pattern a plurality of second metal exit landings (161) in the second metal foil (122). Each of the second metal exit landings is an overlapping pair of via landings, each of whose radius is about 11 mils, and whose center-to-center spacing is about 15 mils, and each of whose greatest extent lies parallel to the quasi-helical central axis in order to contribute to pitch. The reason for this spacing of about 15 mils is that that the vias should pierce through the upper structural dielectric (30 mils thick) and the lower structural dielectric (30 mils thick), together with the about 15 mil jog due to shape of the second metal exit landings, constitute the risers and landings of a staircase approximation to the upper traces, each of which itself is about 60 mils long and inclined at about (90–14.5 degrees), or 75 degrees, to the quasi-helical axis.

Step 5: Pattern a plurality of second metal entrance landings (181) in the second metal foil (122). Each second metal entrance landing has about the same shape, size, and orientation as a second metal exit landing, but differs in its placement since the second metal entrance landing receives a via from the opposite end of an upper trace.

Step 6: Pattern a plurality of upper exit vias (201), each upper exit via (201) connecting electrically a given upper trace exit end (143) with its respective second metal exit landing (161). Each upper exit via is about 10 mils in diameter.

Step 7: Pattern a plurality of upper entrance vias (221), each upper entrance via (221) connecting electrically a given upper trace entrance end (142) with its respective second metal entrance landing (181). Like the upper exit vias, each upper entrance via is about 10 mils in diameter.

Step 8: Laminate a third metal foil (241) and a fourth metal foil (242) upon opposite faces of a lower structural dielectric (243). This step is analogous to Step 2 of Example 1, except that here the lower semi-periods of the quasi-helix are formed rather than the upper semi-periods.

Step 9: Pattern a plurality of third metal exit landings (261) in the third metal foil (241). This step is analogous to Step 4 of Example 1, except that here the third metal exit landings are formed rather than the second metal exit landings.

Step 10: Pattern a plurality of third metal entrance landings (281) in the third metal foil (241). This step is analogous to Step 5 of Example 1, except that here the third metal entrance landings are formed rather than the second metal entrance landings.

Step 11: Pattern a plurality of lower traces (301) in the fourth metal foil (242), the lower traces (301) each having a lower trace entrance end (302) and a lower trace exit end (303). This step is analogous to Step 3 of Example 1, except that here the lower traces are formed rather than the upper traces.

Step 12: Pattern a plurality of lower exit vias (321), each lower exit via (321) connecting electrically a given lower trace exit end (303) and its respective third metal exit landing (261). This step is analogous to Step 6 of Example 1, except that here the lower exit vias are formed rather than the upper exit vias.

Step 13: Pattern a plurality of lower entrance vias (341), each lower entrance via (341) connecting electrically a given lower trace entrance end (302) and the third metal entrance landing (281). This step is analogous to Step 7 of Example 1, except that here the lower entrance vias are formed rather than the upper entrance vias.

Step 14: Laminate the upper structural dielectric (123) to the lower structural dielectric (243) via an intervening prepreg dielectric (360); such that the plurality of second metal exit landings (161) in plan view about coincides with and electrically couples with the plurality of third metal entrance landings (281); wherein the plurality of second metal entrance landings (181) in plan view about coincides with and electrically couples with the plurality of third metal exit landings (261); wherein the chain (1220), from a given upper trace exit end (143), to its respective upper exit via (201), to its respective second metal exit landing (161), to its respective third metal entrance landing (281), to its respective lower entrance via (341), to its respective lower trace entrance end (302), to its respective lower trace exit end (303), to its respective lower exit via (321), to its respective third metal exit landing (261), to its respective second metal entrance landing (181), to its respective upper entrance via (221), to its respective upper trace entrance end (142) in the subsequent upper trace (141), creates one period of the quasi-helix. The thickness of the intervening prepreg dielectric is about 4.8 mils, in its as-fabricated-yet-uncured state. Because, in its as-fabricated-yet-uncured state, the intervening prepreg dielectric is more compliant than the rigid, plated, upper and lower structural dielectrics, the separation between the lower surface of the second metal foil and the upper surface of the first metal foil is as little as about (4.8 mils–0.7 mils–0.7 mils), or 3.4 mils. This small inter-layer separation increases the capacitance between the second metal foil and the third metal foil favorably, for the purpose of their non-galvanic, electric field coupling.

Step 15: Laminate a further non metallized dielectric lamina of suitable dielectric, whose thickness is about 2.50 mil, onto each surface of the assembly from Step 14 of Example 1, then laminate a further non metallized dielectric lamina of suitable dielectric of thickness about 90 mil onto each surface. The total thickness, as a result of this operation is now about (90 mil+2.5 mil+30 mil+4.8 mil+30 mil+2.5 mil+90 mil), or 250 mils, and the quasi-helical antenna now lies embedded entirely, and accurately within the suitable dielectric. Referring now to FIG. 4A, the number of turns for the quasi-helical antenna is about 6, since there are 6 complete lower traces, and 5 complete upper traces plus about half an upper trace of lead-in plus about half an upper trace of lead-out. The exact length of the lead-out upper trace, which lies at the far end of the quasi-helix, i.e., the end opposite the coaxial feed connector, is available for design discretion in order to tune the eccentricity of the elliptically polarized electromagnetic wave emitted to be as close to circularly polarized as possible. Such tuning may be accomplished with the aid of electromagnetic field simulation software, since the geometry of the quasi-helix may be too complex to be derived by any analytical expression for tuning the eccentricity of the electromagnetic wave emitted.

Step 16: Drill a pair of mechanical datum holes into the assembly, where the holes are about 47 mils in diameter, about 100 mils from each narrow end of the assembly, and about centered laterally. The placement of the mechanical datum holes is precisely registered with respect to the geometries upper and lower traces, vias, and landings, as all bores must necessarily be during printed circuit board manufacture, in order to ensure the faithful reproduction of the designed conductor topologies.

Step 17: Route a board outline symmetrically around each quasi-helix in a rectangular shape whose net dimensions are about 250 mils by 6500 mils.

Example 1 demonstrates one embodiment using galvanically coupled and capacitively coupled structures using PCB technology. Note that other embodiments may be constructed using different numbers of layers of materials. These embodiments may include 2, 3, 4, 5, 6, 7, 8, 9, 10, 11, 12 or more layers. Some embodiments, such as an embodiment with only 2 conductive layers may feature galvanic coupling of all traces instead of relying on capacitive coupling to couple some of the traces.

Example 2: Machining of Dielectric Waveguide Blank to Form Dielectric Waveguide Antenna Step 1: Referring now to FIG. 6, position the dielectric waveguide blank in a lathe, using the pair of mechanical datum holes to orient the blank within the lathe such that the axis of the quasi-helical antenna is coaxial with the turning axis of the lathe. Since the antenna pattern, and the orientation of its main lobe, depend in a dielectric waveguide antenna upon both the orientation of the quasi-helical antenna and upon the orientation of the finished form of the polymer encapsulating it, maintaining the relative alignment of these two axes of symmetry under strict control implies, among other consequences, that the main lobe of the dielectric waveguide antenna may be predictably aimed by aiming the axis of symmetry of the finished form of the dielectric waveguide antenna in the same direction. The polymer body of the dielectric waveguide antenna contributes refractive focusing to the main beam of the antenna pattern because its relative dielectric constant exceeds 1.0.

Step 2: Machine the dielectric waveguide blank. Referring now to FIG. 6, the dielectric waveguide antenna blank is lathe-turned to a round cross section whose maximum diameter, the stem diameter, is about 100 mils, and whose minimum diameter, the tip diameter, is about 40 mils. Beginning from the stem end, the finished profile of the dielectric waveguide antenna may have some extent wherein the diameter remains constant, then may taper by any of various profiles, and then may conclude to the tip with another extent wherein the diameter remains constant. The turned dielectric waveguide antenna is then sawn at its base and its stem to free it from the remnant stock. Choosing to saw the tip end such that the overall length of the dielectric waveguide antenna is longer narrows the main lobe of its antenna pattern, while choosing to saw the tip end such that the overall length of the dielectric waveguide antenna is shorter broadens the main lobe of its antenna pattern. Finally, a flat is machined on the stem end of the turned and sawn dielectric waveguide antenna in order to expose the conductor footprint at the base of the dielectric waveguide antenna, so that it may be soldered to a compatible coaxial connector. The coaxial connector is of type SMPS, which operates below about 65 GHz exclusively in TEM mode. FIG. 6 diagrams the emergence of the dielectric waveguide antenna, whose cross-section is circular, from the dielectric waveguide antenna blank, whose cross-section is rectangular, due to this sequence of machining operations.

Example 3: Maximizing the Return Loss Observed at the Coaxial Connector of the Dielectric Waveguide Antenna Step 1: Referring now to FIG. 4A and FIG. 6, tuning of the quasi-helix design may be accomplished with the aid of electromagnetic field simulation software. The coaxial connector mounts to a connector footprint patterned into the same metal layer that constitutes the upper traces of the quasi-helix. The remaining three metal foil layers below the coaxial connector footprint are all patterned as solid local ground planes, which then are stitched to the outer conductor terminals of the coaxial connector footprint with a plurality of vias piercing all four layers. This collection of grounded features constitutes an approximation to a backing reflector, such as is designated the ground plane in FIG. 1.

Step 2: The length and width of the feed trace, from coaxial connector center conductor, to the half an upper trace lead-in to the quasi-helix, admit sufficient design discretion to accomplish complex conjugate load matching between the quasi-helical antenna and the 50 ohm reference characteristic impedance of the SMPS coaxial connector. For the case of the dielectric waveguide antenna detailed in Example 1 above, the optimal feed trace length was found to be about half a wavelength at the design center frequency in the suitable dielectric media, or 114 mils, as measured between the backing reflector and the half an upper trace lead-in to the quasi-helix. The dimension of about half a wavelength in the suitable dielectric for the feed trace length may be expected since the quasi-helix antenna may launch traveling waves in both directions along its central axis, and since the reflection of the traveling wave incident upon the quasi-helix from the coaxial connector is phase shifted by about half a wavelength due traveling to the length of the feed trace, plus a further half a wavelength due to the electric wall boundary condition caused by the backing reflector, with the result that the triple-travel wave traveling toward the tip of the dielectric waveguide antenna experiences constructive interference at the design center frequency. Again for the case of the dielectric waveguide antenna detailed in Example 1 above, the optimal feed trace width was found to be about 10 mils, which is the same as the width of the upper traces and lower traces of the quasi-helix.

As used herein, the term "about" refers to plus or minus 10% of the referenced number.

Although there has been shown and described the preferred embodiment of the present invention, it will be readily apparent to those skilled in the art that modifications may be made thereto which do not exceed the scope of the appended claims. Therefore, the scope of the invention is only to be limited by the following claims. In some embodiments, the figures presented in this patent application are drawn to scale, including the angles, ratios of dimensions, etc. In some embodiments, the figures are representative only and the claims are not limited by the dimensions of the figures. In some embodiments, descriptions of the inventions described herein using the phrase "comprising" includes embodiments that could be described as "consisting essentially of" or "consisting of", and as such the written description requirement for claiming one or more embodiments of the present invention using the phrase "consisting essentially of" or "consisting of" is met.

The reference numbers recited in the below claims are solely for ease of examination of this patent application, and are exemplary, and are not intended in any way to limit the scope of the claims to the particular features having the corresponding reference numbers in the drawings.

What is claimed is:

1. A quasi-helical antenna (1000), comprising a plurality of substantially straight conductive segments (1120), arranged in a sequence around a central axis (1200) in a periodic, repeating, quasi-helical arrangement, wherein each conductive segment (1120) is electrically coupled to one or more adjacent conductive segments (1120) in the sequence, wherein the antenna (1000) is configured to emit or receive electromagnetic energy as a beam or region aligned with the central axis (1200), wherein the conductive segments (1120) form a plurality of half-periods (1210), and wherein the plurality of half-periods (1210) are joined head-to-tail or end-to-end by parallel-plate capacitors (1160).

2. A quasi-helical antenna (1000), comprising a plurality of substantially straight conductive segments (1120), arranged in a sequence around a central axis (1200) in a periodic, repeating, quasi-helical arrangement, wherein each conductive segment (1120) is electrically coupled to one or more adjacent conductive segments (1120) in the sequence, wherein the antenna (1000) is configured to emit or receive electromagnetic energy as a beam or region aligned with the central axis (1200), wherein the conductive segments (1120) are patterned within a stack of printed circuit boards (PCB) (1100), wherein one or more of the conductive segments (1120) comprise one or more traces (1135) on one or more surfaces (1140) of one or more PCBs of the stack of PCBs (1100) and one or more of the conductive segments (1120) comprise one or more vias (1130) between two or more surfaces (1140) of two or more PCBs of the stack of PCBs (1100).

3. The quasi-helical antenna (1000) of claim 2, wherein the central axis (1200) is parallel to a plane of each PCB within the stack of PCBs, and wherein the quasi-helical antenna (1000) is configured to emit or receive the electromagnetic energy from an end of the stack.

4. The quasi-helical antenna (1000) of claim 2, wherein the vias (1130) are perpendicular to the two or more surfaces (1140) of the two or more PCBs or angled between the two or more surfaces (1140) of the two or more PCBs.

5. A method of forming a quasi-helical antenna (1000), the method comprising:
   a) providing a plurality of planar printed circuit board (PCB) substrates (1110);
   b) patterning each of the PCB substrates (1110) with a plurality of electrically conducting traces (1135) and a plurality of electrically conducting vias (1130); and
   c) joining the PCB substrates (1110) to form a multi-layer printed circuit (1150), comprising a periodic quasi-helical chain (1220) of the traces (1135) and the dvias (1130), wherein the chain (1220) is arranged about a central axis (1200) which is parallel to each of the PCB substrates (1110);
   wherein the periodic quasi-helical chain (1220) is configured to emit or receive a beam which is aligned with the central axis (1200).

6. The method of claim 5, wherein the periodic quasi-helical chain (1220) comprises an alternating sequence of the traces (1135) and the vias (1130).

7. The method of claim 5, wherein the periodic quasi-helical chain (1220) comprises a plurality of electrically coupled conductive segments (1120).

8. The method of claim 7, wherein the conductive segments (1120) are coupled by parallel-plate capacitors (1160).

9. The method of claim 8, wherein the parallel-plate capacitors (1160) are formed by alignment of the traces (1135).

10. The method of claim 5, wherein the multi-layer printed circuit (1150) comprises two or more layers of traces (1135) and one or more layers of vias (1130).

11. The method of claim 5, wherein a geometry of the periodic quasi-helical chain (1220) is configured in periodic pitch and cross-section to radiate electromagnetic wave power efficiently along the central axis (1200) at a center frequency.

* * * * *